(12) United States Patent
Lu et al.

(10) Patent No.: US 10,895,006 B2
(45) Date of Patent: Jan. 19, 2021

(54) METALLIC STRUCTURE

(71) Applicant: City University of Hong Kong, Kowloon (HK)

(72) Inventors: Jian Lu, Kowloon (HK); Ge Wu, Kowloon (HK)

(73) Assignee: City University of Hong Kong, Kowloon (HK)

( * ) Notice: Subject to any disclaimer, the term of this patent is extended or adjusted under 35 U.S.C. 154(b) by 603 days.

(21) Appl. No.: 15/345,863

(22) Filed: Nov. 8, 2016

(65) Prior Publication Data

US 2018/0127867 A1 May 10, 2018

(51) Int. Cl.
*B32B 15/01* (2006.01)
*C23C 14/35* (2006.01)
(Continued)

(52) U.S. Cl.
CPC ............. *C23C 14/35* (2013.01); *B32B 7/02* (2013.01); *B32B 15/00* (2013.01); *B32B 15/01* (2013.01); *B32B 15/16* (2013.01); *C22C 1/002* (2013.01); *C22C 18/00* (2013.01); *C22C 23/00* (2013.01); *C22C 45/00* (2013.01); *C22C 45/005* (2013.01); *C22F 1/047* (2013.01); *C22F 1/06* (2013.01); *C22F 3/00* (2013.01); *C23C 14/024* (2013.01); *C23C 14/025* (2013.01); *C23C 14/027* (2013.01); *C23C 14/028* (2013.01);
(Continued)

(58) Field of Classification Search
CPC ....... C23C 30/00; C23C 30/005; C23C 28/02; C23C 28/021; C23C 28/023; C23C 28/026; C23C 28/028; C23C 28/36; C23C 14/028; C23C 14/024; C23C 14/027; C23C 14/025; C23C 14/165; C23C 14/35; C23C 14/541; C23C 14/548; C23C 14/542; C23C 14/14; C23C 14/16; C23C 14/18; C23C 14/185; C23C 14/5886; C22C 23/02; C22C 23/04; C22C 23/00; C22C 18/00; C22C 45/00; C22C 45/005; C22C 1/002; C22F 1/047; C22F 3/00; C22F 1/06; B32B 15/01; B32B 15/00; B32B 15/16; B32B 7/02; Y10T 428/12458; Y10T 428/12729; Y10T 428/12993
See application file for complete search history.

(56) References Cited

U.S. PATENT DOCUMENTS

2008/0248222 A1* 10/2008 Ohara ................. B32B 15/01
428/34.6

FOREIGN PATENT DOCUMENTS

WO WO-2016074161 A1 * 5/2016 ............... C21D 7/06

OTHER PUBLICATIONS

J. Fan, et al., "Improved Plasticity and fracture toughness in metallic glasses via surface crystallization," in Intermetallics 19 (2011, no month) 1420-27. (Year: 2011).*

(Continued)

*Primary Examiner* — Michael E. La Villa
(74) *Attorney, Agent, or Firm* — Renner, Kenner, Greive, Bobak, Taylor & Weber

(57) ABSTRACT

A metallic structure includes a first plurality of metal particles arranged in an amorphous structure; a second plurality of metal particles arranged in a crystalline structure having at least two grain sizes, wherein the crystalline structure is arranged to receive the amorphous structure deposited thereon; wherein the grain size is arranged in a gradient structure.

15 Claims, 12 Drawing Sheets

(51) Int. Cl.
*C23C 14/16* (2006.01)
*C23C 14/54* (2006.01)
*C23C 14/02* (2006.01)
*C22C 18/00* (2006.01)
*C22C 1/00* (2006.01)
*C22C 45/00* (2006.01)
*C22F 1/06* (2006.01)
*C23C 28/02* (2006.01)
*C23C 30/00* (2006.01)
*C23C 14/18* (2006.01)
*C22F 1/047* (2006.01)
*C23C 14/58* (2006.01)
*C23C 28/00* (2006.01)
*C22F 3/00* (2006.01)
*C22C 23/00* (2006.01)
*C23C 14/14* (2006.01)
*B32B 7/02* (2019.01)
*B32B 15/00* (2006.01)
*B32B 15/16* (2006.01)
*C22C 23/02* (2006.01)
*C22C 23/04* (2006.01)

(52) U.S. Cl.
CPC .............. *C23C 14/14* (2013.01); *C23C 14/16* (2013.01); *C23C 14/165* (2013.01); *C23C 14/18* (2013.01); *C23C 14/185* (2013.01); *C23C 14/541* (2013.01); *C23C 14/542* (2013.01); *C23C 14/548* (2013.01); *C23C 14/5886* (2013.01); *C23C 28/02* (2013.01); *C23C 28/021* (2013.01); *C23C 28/023* (2013.01); *C23C 28/026* (2013.01); *C23C 28/028* (2013.01); *C23C 28/36* (2013.01); *C23C 30/00* (2013.01); *C23C 30/005* (2013.01); *C22C 23/02* (2013.01); *C22C 23/04* (2013.01); *Y10T 428/12458* (2015.01); *Y10T 428/12729* (2015.01); *Y10T 428/12993* (2015.01)

(56) References Cited

OTHER PUBLICATIONS

M.C. Liu, et al., "Superplastic-like Deformation in Metallic Amorphous/Crystalline Nanolayered Micropillars," Intermetallics, 30 (Apr. 2012), 30-34. (Year: 2012).*

* cited by examiner

METALLIC STRUCTURE

TECHNICAL FIELD

The present invention relates to a metallic structure and a method for use in fabricating thereof, and particularly, although not exclusively, to a metallic structure and a method for use in fabricating thereof by depositing a metal layer on a substrate.

BACKGROUND

A material's strength reflects the ability for it to withstand an applied load without failure or plastic deformation. Every material is unique and thus each possesses a different set of strength based characteristics. In the study of material strength, the tensile strength, compressive strength, and shear strength are analyzed independently. The tensile strength of a material, which measures its resistance to be pulled apart, for example by tension, may be measured by the maximum stress that a material can withstand while being stretched or pulled before reaching its breaking point.

In some situations, materials may be adapted in various applications with severity of environmental conditions, such as high temperatures, high strain rates, high stress and high sliding velocities. As such, their material proprieties such as wear and corrosion resistance, apart from the aforesaid strength, must be studied carefully in a more comprehensive manner, thereby ensuring the right materials are selected to perform under these undesirable conditions.

SUMMARY OF THE INVENTION

In accordance with a first aspect of the present invention, there is provided a metallic structure comprising a first plurality of metal particles arranged in an amorphous structure; a second plurality of metal particles arranged in a crystalline structure having at least two grain sizes, wherein the crystalline structure is arranged to receive the amorphous structure deposited thereon.

In an embodiment of the first aspect, the grain size is arranged in a gradient structure.

In an embodiment of the first aspect, the grain sizes of the gradient structure decreases gradually from the center to the surface.

In an embodiment of the first aspect, the gradient structure includes coarse crystal at the center.

In an embodiment of the first aspect, the gradient structure further includes a nanocrystalline surface.

In an embodiment of the first aspect, the grain of the nanocrystalline surface includes a size smaller than or equal to 1 μm.

In an embodiment of the first aspect, the amorphous structure is arranged to form a metallic glass film.

In an embodiment of the first aspect, the surface of the crystalline structure includes only minor surface indentation and cracking about the surface indentation upon being deposited with the amorphous structure thereon.

In an embodiment of the first aspect, the surface indentation and non-substantial cracking are significantly reduced by the high diffusion factor of the crystalline structure.

In an embodiment of the first aspect, the amorphous structure and the crystalline structure form a multilayer gradient structure.

In an embodiment of the first aspect, the metal material includes an increased yield strength and ultimate tensile strength of at least 24% and 13% respectively over an untreated metal material with substantially the same ductility.

In an embodiment of the first aspect, the metal material includes an increased wear resistance of at least 65% over an untreated metal material.

In an embodiment of the first aspect, the metal material includes an increased corrosive resistance at least 5 times of an untreated metal material.

In an embodiment of the first aspect, the crystalline structure includes an increased hardness of at least 60% over an untreated metal material and the amorphous structure includes a hardness of at least 3.02 GPa respectively.

In accordance with a second aspect of the present invention, there is provided a method for use in fabricating a metallic structure, comprising the step of depositing a metal layer having a first plurality of metal particles arranged in an amorphous structure on a substrate; wherein the substrate includes a second plurality of metal particles arranged in a crystalline structure having at least two grain sizes.

In an embodiment of the second aspect, the substrate is processed by a physical treatment to form the crystalline structure.

In an embodiment of the second aspect, the substrate is further processed by the physical treatment to form a nanocrystalline surface.

In an embodiment of the second aspect, the grain size is arranged in a gradient structure.

In an embodiment of the second aspect, the grain size of the gradient structure is manipulated by the physical treatment such as high strain rate SMAT process.

In an embodiment of the second aspect, the metal layer is deposited in a magnetron sputtering process.

In an embodiment of the second aspect, the thickness and/or the composition of the metal layer is manipulated by the magnetron sputtering process.

In an embodiment of the second aspect, a single alloy target is used in the magnetron sputtering process.

In an embodiment of the second aspect, the single alloy target comprises magnesium, zinc and calcium.

In an embodiment of the second aspect, an atomic ratio of magnesium, zinc and calcium is equal to 60:35:5.

In an embodiment of the second aspect, the magnetron sputtering process includes the following parameters:

Background vacuum pressure: $\leq 1\times 10^{-4}$ Pa;

Substrate temperature: $\leq 50°$ C.

In an embodiment of the second aspect, the metal layer includes a thickness of 1-15 μm.

In an embodiment of the second aspect, the substrate includes a thickness of 0.8-1.8 mm.

BRIEF DESCRIPTION OF THE DRAWINGS

Embodiments of the present invention will now be described, by way of examples, with reference to the accompanying drawings in which.

DETAILED DESCRIPTION OF THE PREFERRED EMBODIMENT

Without wishing to be bound by theory, the inventors, through their own research via trials and experimentation, have discovered that strength, plasticity, wear resistance and corrosion resistance are amongst the most important criteria for adapting alloy as a structural material. However, it would be readily appreciated by person skilled in the art these said criteria may not be presented within one single material. For instance, although conventional high plastic deformed alloys possess greater strength than those of initial alloys, its plasticity is greatly reduced.

To mitigate or alleviate at least part of the aforesaid problems, the inventors have devised a method for fabricating multilayer gradient structural alloy. In this method, examples of its application may cause the size of the grain to gradually decrease from a center of the material to its surface, and an amorphous alloy film may be received on the top surface. The gradient structure of the alloy may be generated by physical treatment such as surface mechanical attrition treatment (SMAT), and the amorphous alloy film may then be deposited by magnetron sputtering. Advantageously, the fabricated multilayer gradient structural alloy may possess high strength, high wear resistance and high corrosion resistance.

Figure 1:
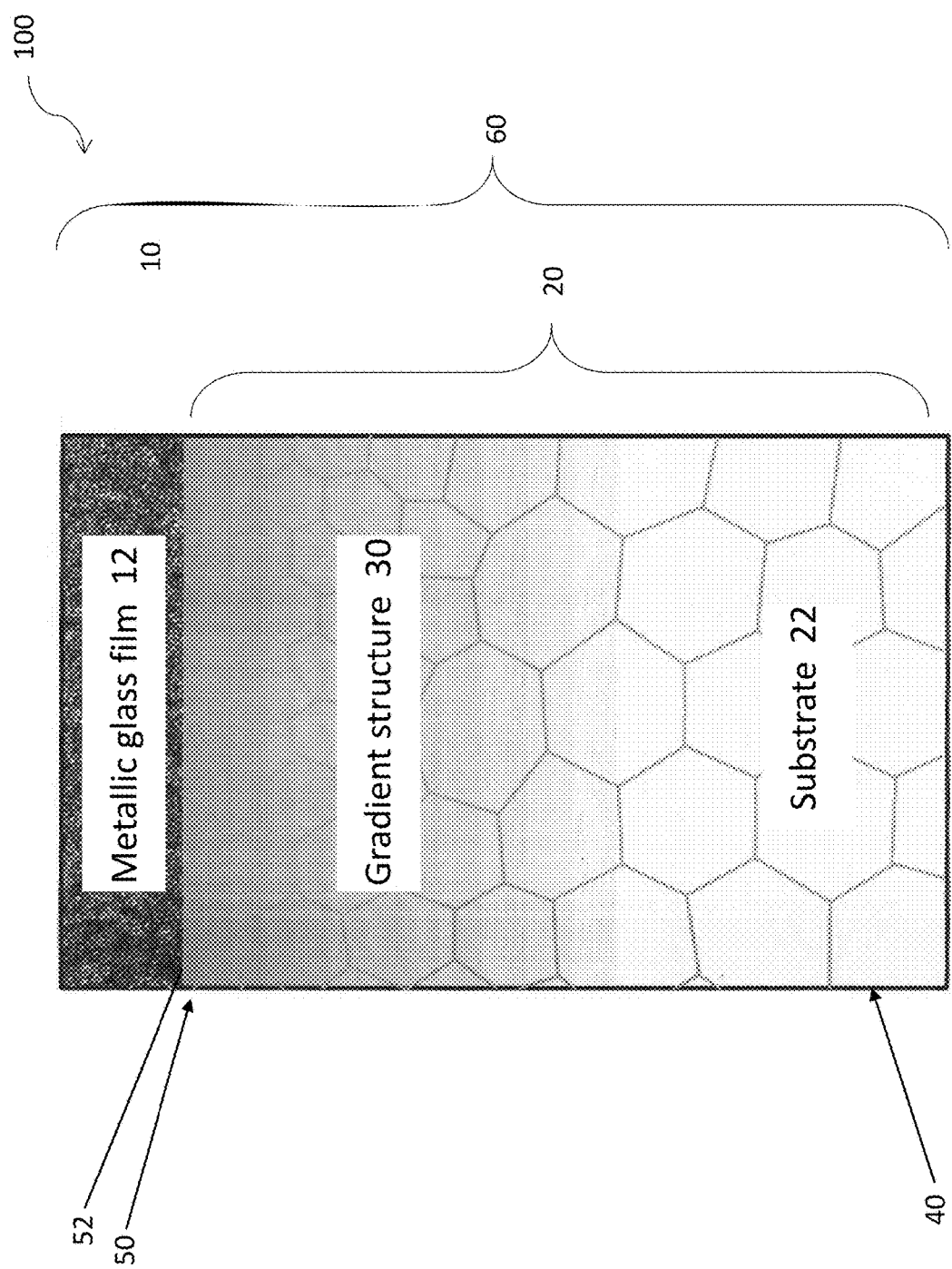
FIG. 1 is an illustration of a metallic structure in accordance with the invention.

With refer to FIG. 1, there is provided a metallic structure 100 comprising a first plurality of metal particles arranged in an amorphous structure 10; a second plurality of metal particles arranged in a crystalline structure 20 having at least two grain sizes, wherein the crystalline structure 20 is arranged to receive the amorphous structure 10 deposited thereon.

In this embodiment, the grain sizes of the crystalline structure 20 are preferably arranged as a gradient structure 30. The crystalline structure 20 may be processed by a physical treatment e.g. SMAT, such that the grain sizes of such gradient structure 30 may decrease gradually from the center 40 of the metallic structure 100 to the surface 50 of the metallic structure 100 and thereby forming nanocrystalline structure.

By impacting a metal material with high energy particle through SMAT, the metallic structure 100 forms a gradient structure 30 comprising nanocyrstalline/twincrystalline layer-nanocrystalline layer-coarse crystalline layer. This significantly enhances the physical properties of the metal material such as strength, corrosion resistance and the like.

Preferably, the crystalline structure 20 at the center 40 may be coarse crystal and on the other hand, the crystalline structure at the surface 50 may be finer crystal for forming a nanocrystalline surface 52. For instance, the grain of the nanocrystalline surface 52 may include a size smaller than or equal to 1 μm.

The inventors have further devised that metallic glass films possess high strength and high hardness. Such materials may be deposited on the substrate surface to enhance the fatigue properties and wear resistance of the substrate material. By depositing the metal glass film on the alloy surface, the weak wear resistance of alloys may be overcome. As the amorphous structure of the metallic glass may undergo corrosion difficult comparing to the grain boundaries and dislocations structures of crystalline material, the amorphous structure generally provide better corrosion resistance than corresponding structure in crystalline form.

In this embodiment, the crystalline structure 20, as a substrate 22, may be deposited a metal layer/metallic glass film 12 with an amorphous structure 10 thereon, for example, by sputtering and more preferably by magnetron sputtering process thereby forming a multilayer gradient structure 60. In one example, the thickness of the alloy substrate 22 may be ranged from 0.8 to 1.8 mm, and the thickness of the metallic glass film 12 may be ranged from 1 to 15 μm.

Upon being deposited with the amorphous structure 20 thereon, the surface 50 of the crystalline structure 20 includes only minor surface indentation and cracking about the surface indentation. As discovered by the inventors, the surface indentation and non-substantial cracking are significantly reduced by the high diffusion factor of the crystalline structure 20.

Advantageously, as the nanocrystalline structure 52 on the surface 50 of the SMAT treated alloys possesses high diffusion factor, it facilities the permeation of the atom of the film/coating 12 into the substrate 22, and thereby enhancing the adhesion between the film/coating 12 and the substrate 22. This significantly reduces the complexity of the conventional surface treating techniques, and thus reduces the cost incurred during fabrication.

Turning now to the method for use in fabricating the metallic structure 100, the method includes the step of depositing a metal layer 12 having a first plurality of metal particles arranged in an amorphous structure 10 on a substrate 22; wherein the substrate 22 includes a second plurality of metal particles arranged in a crystalline structure 20 having at least two grain sizes.

Advantageously, the high energy particles may trigger high strain rate plastic deformation on the metal material surface. This may greatly enhance the degree of crystallization of the metal material surface, increase the surface hardness and in turn, increase the overall mechanical strength of the metal material. Meanwhile, the high diffusion performance of the material surface may be increased under the nanocrystallisation on the material surface. This facilitates the high diffusion factor of the permeated atom.

In one embodiment, the method for use in fabricating a multilayer gradient structure alloy, comprising the step of:—

Step 1: Double side treating the alloy plate with SMAT.

Step 2: Double side polishing the SMAT treated alloy plate. Preferably, the polished plate is washed by first placing the plate into acetone for ultrasonic cleaning of 10 minutes. The plate is then placed into alcohol for ultrasonic cleaning of 10 minutes. Subsequently, the alcohol on the surface is dried with nitrogen gun.

Step 3: Fabricating an alloy target with glass forming ability for use in the sputtering process. Preferably, the raw material of the alloy target comprises a purity of higher than 99.9%. Preferably, the method of fabricating the alloy target may be smelting, molten melting or powder pressing.

Step 4: Positioning the alloy target and the SMAT treated and polished alloy into a sputtering chamber. The sputtering parameters are adjusted to the suitable parameters for performing double side magnetron sputtering, thereby obtaining a multilayer gradient structure alloy. Preferably, the sputtering vacuum pressure is lower than $5.5\times10^{-5}$ Pa, and the substrate temperature is lower than 50° C. in the sputtering process.

Advantageously, the metal plate 22 may be provided with a gradient structure 30 from fine crystal to coarse crystal by using SMAT, thereby enhance its overall mechanical properties. The nanocyrstalline layer 52 introduced by the SMAT treatment may provide better adhesive force between the metallic glass film 12 fabricated by magnetron sputtering and the alloy plate 22. Preferably, the thickness and the composition of the metallic glass film 12 may be adjustable by single alloy target sputtering and thus, the cost associated with the fabrication may be reduced. Preferably, the single alloy target may comprise magnesium, zinc and calcium.

The inventors have devised that although the mechanical properties of the conventional alloys may be manipulated by SMAT treatment, its crystalline characteristic prevent SMAT from enhancing the corrosion resistance of alloys. On the other hand, metallic glass film 12 is one of the amorphous alloys and it possesses a better corrosion resistance than its crystalline form. Advantageously, its hardness, which is approximately close to the theoretical hardness, may provide an ultra-high wear characteristic.

In yet another embodiment, the method for use in fabricating a multilayer gradient structure AZ31 Mg alloy, comprising the step of:—

Step 1: Cutting an AZ31 Mg alloy plate with a thickness of 1.7 mm into a shape with length×width each of 7 cm by a cutting method.

Step 2: Placing the cutted AZ31 Mg alloy plate into the SMAT cavity for double side treatment.

Step 3: Placing an alloy target with an atomic ratio of Mg, Zn and Ca equals to 60:35:5 and washed plate into the corresponding resting location of the sputtering chamber respectively.

Step 4: Vacuuming until reaching a pressure of lower than $5.5\times10^{-5}$ Pa/$1\times10^{-4}$ Pa. The sputtering parameters are adjusted to the suitable parameters for depositing the double sides respectively.

The aforesaid multilayer gradient structure AZ31 Mg alloy is tested by the inventors. The metallic glass film 12 and nanocrystalline Mg alloy layer 22 are observed by using a TEM respectively. Tensile tests are performed on the samples by using a tensile testing machine. The hardness distribution and the wear properties of the sample tested by nanoindentation and nanowear are observed, while the corrosion resistance is observed by the electrochemical workstation.

Figure 2:
FIG. 2 is a transmission electron microscopy (TEM) image of the nanocrystalline layer of the multilayer gradient structure AZ31 sample.
Figure 3:
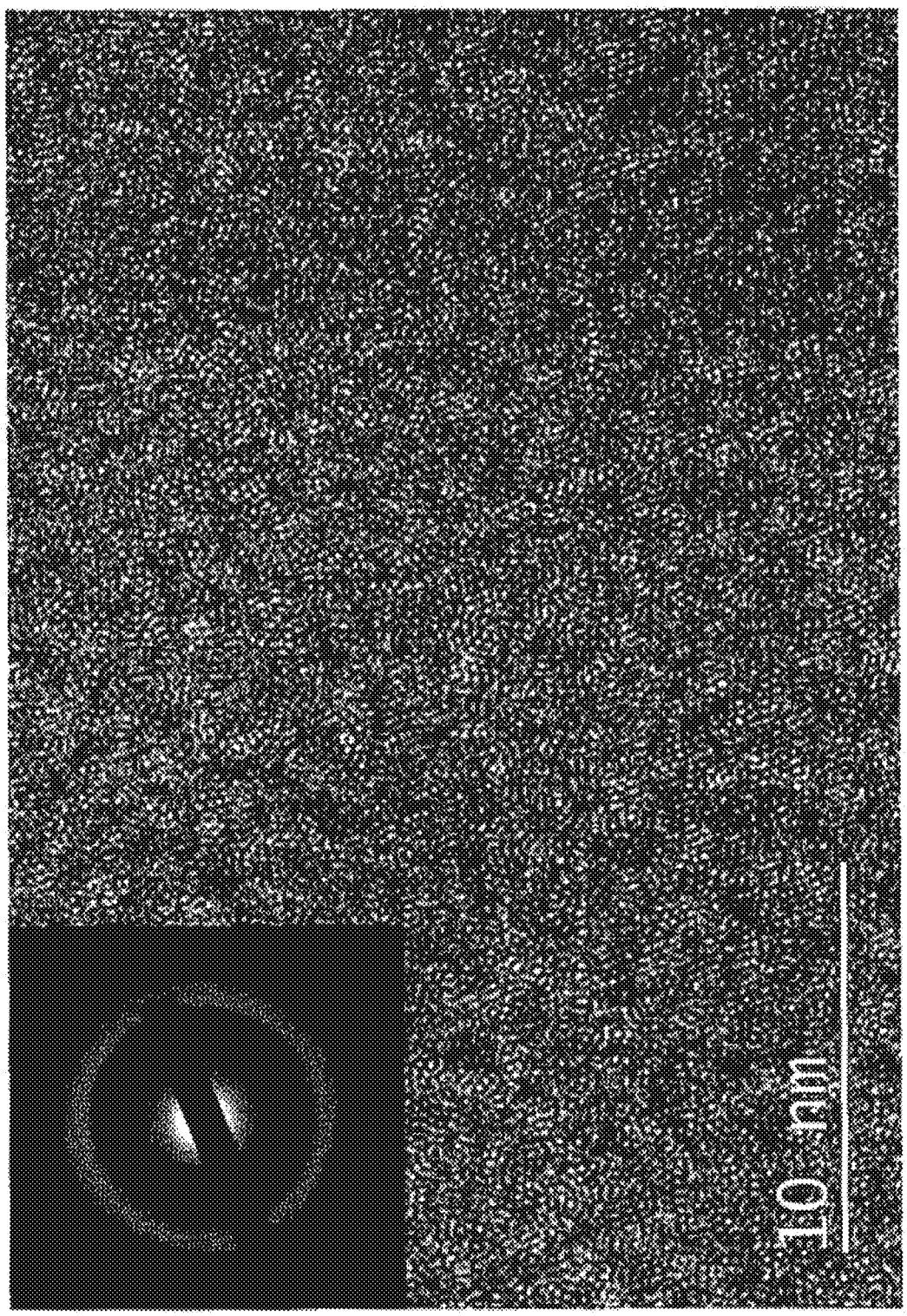
FIG. 3 is a transmission electron microscopy (TEM) image of the metallic glass film of the multilayer gradient structure AZ31 sample.

With reference to FIGS. 2 to 3, there is shown a SMAT treated sample with grain size reduced to 100 nm at the outermost surface 50, while the outermost metal glass film 12 is amorphous.

Figure 4:
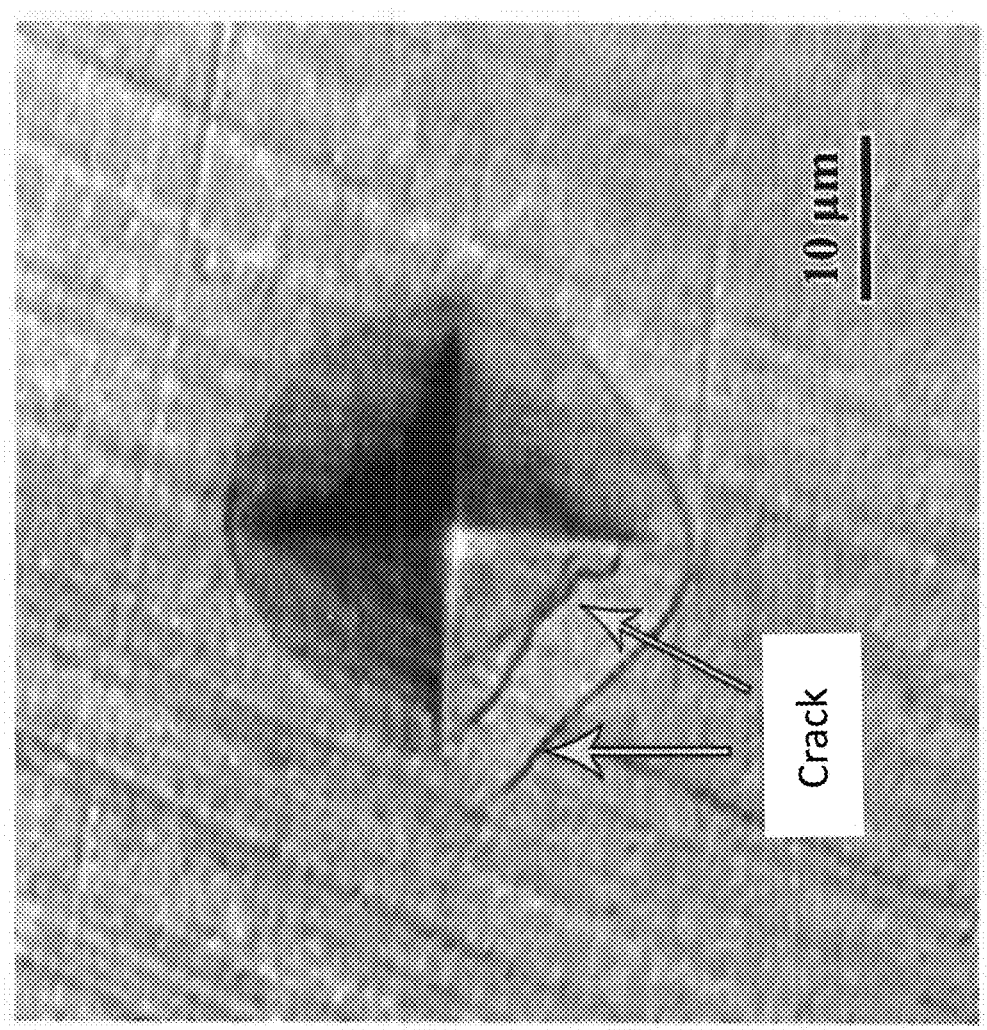
FIG. 4 is optical microscope image of the imprint by 300 mN Vikers indentation for as-received Mg alloy with metallic glass film deposition.
Figure 5:
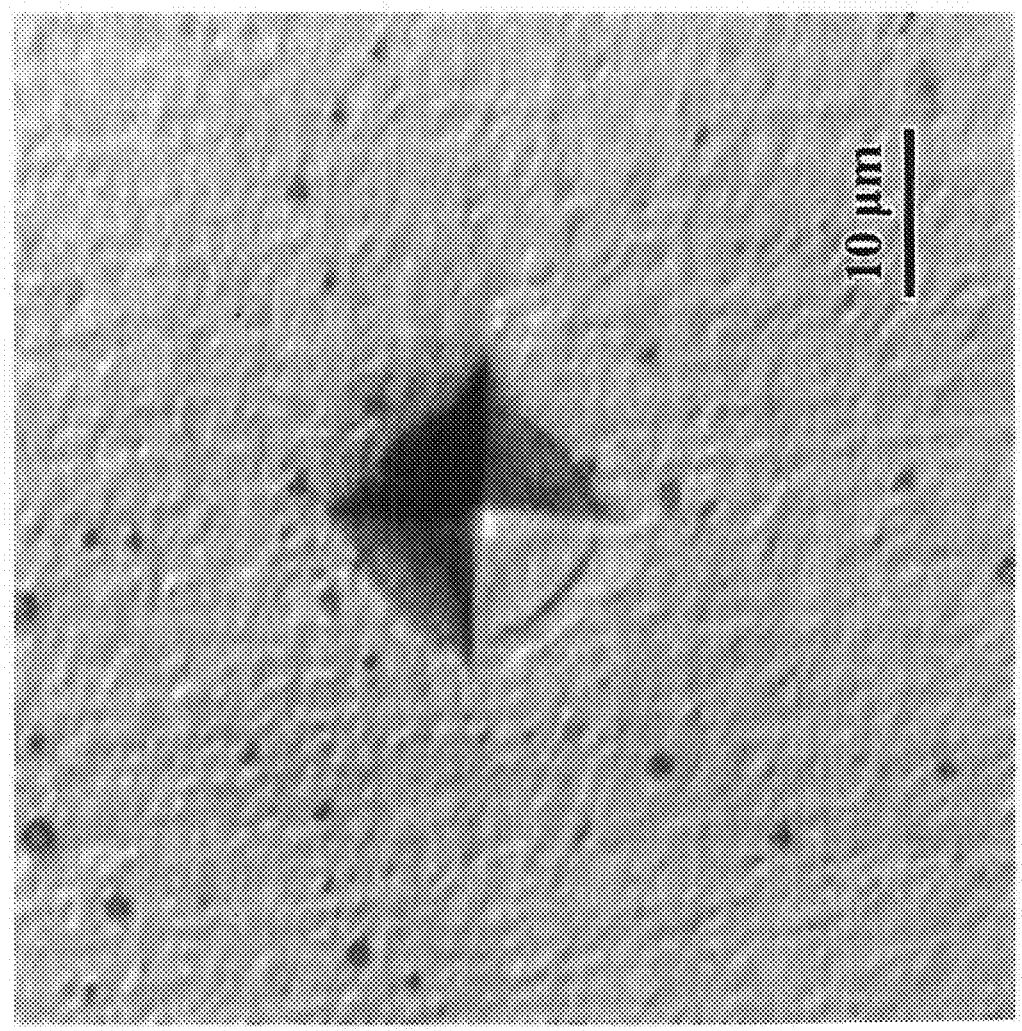
FIG. 5 is optical microscope image of the imprint by 300 mN Vikers indentation for SMATed Mg alloy with metallic glass film deposition.
Figure 6:
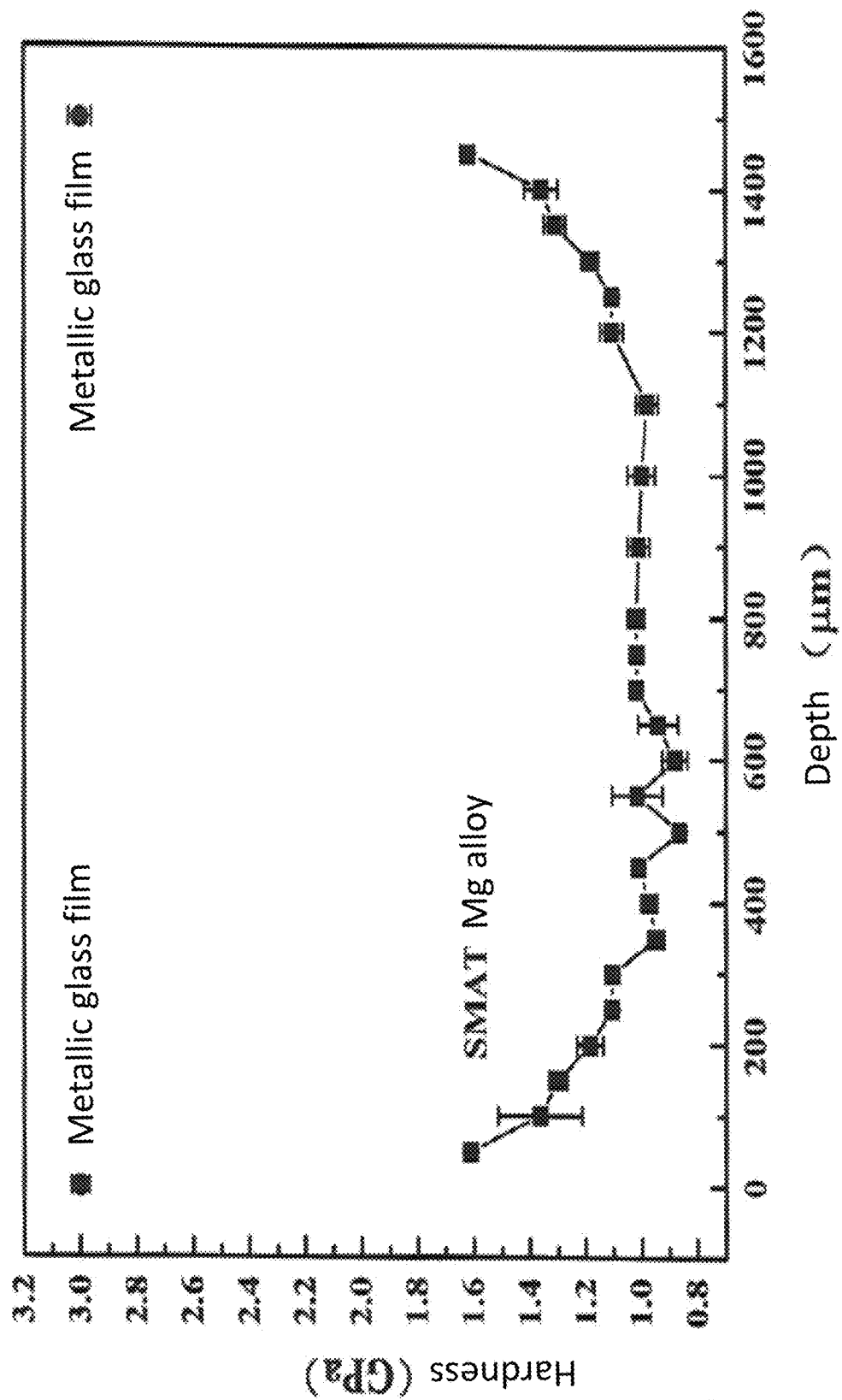
FIG. 6 shows the hardness of the multilayer gradient structure AZ31 sample fabricated in accordance with the invention against the depth.

With reference to FIGS. 4 to 6, there is shown a larger indentation area on the SMAT untreated sample and substantial cracking about the surface indentation after being deposited the metallic glass film 12. On the other hand, there is shown a smaller indentation area on the multilayer SMAT treated sample and merely some non-substantial cracking about the surface indentation after being deposited the metallic glass film 12. The inventors have discovered that the outermost surface metallic glass film 12 and the substrate 22 underneath of the multilayer gradient structure alloy 60 are in excellent adhesion.

Figure 7:
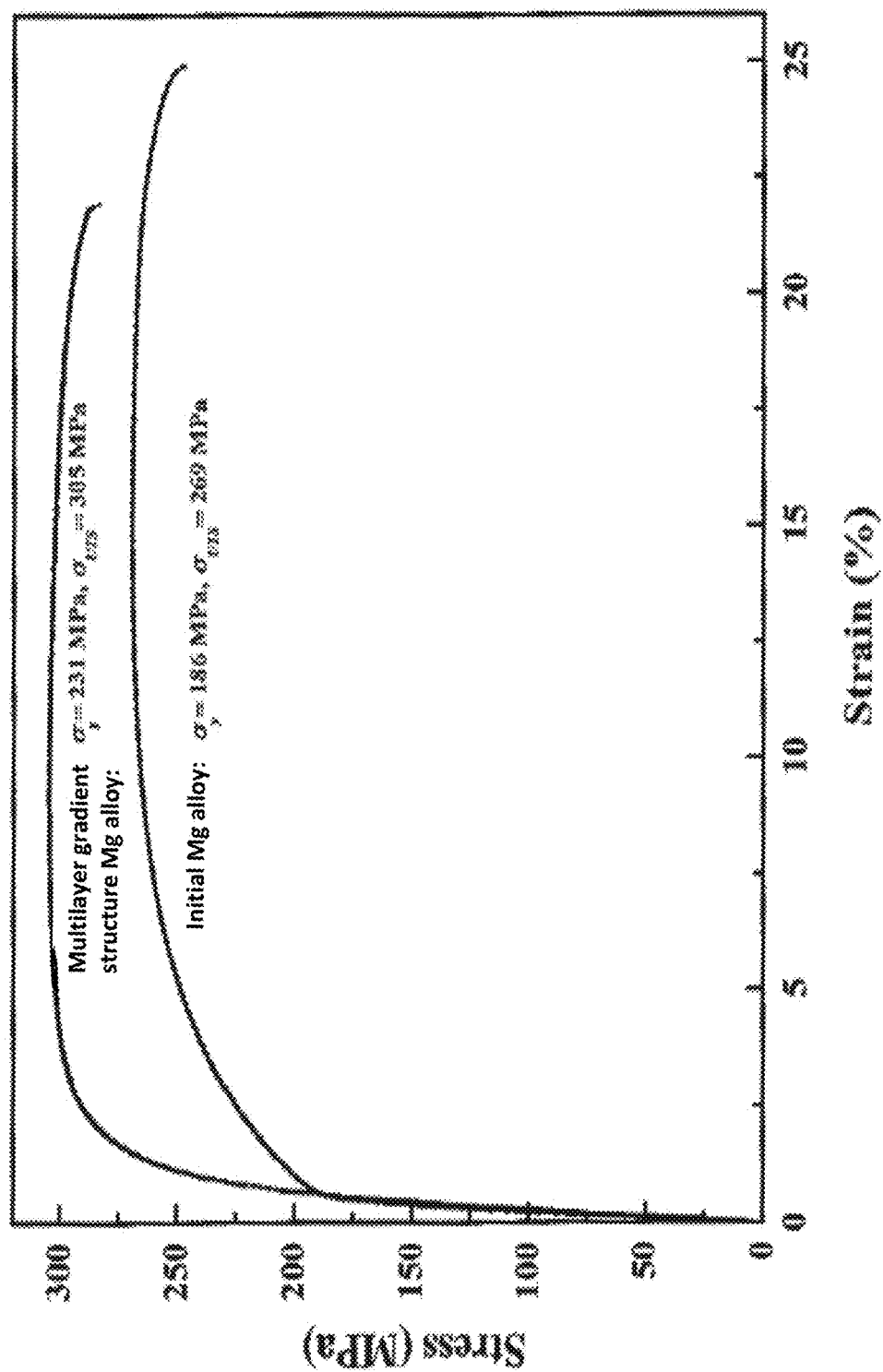
FIG. 7 is the tensile stress-strain curve of the multilayer gradient structure AZ31 sample fabricated in accordance with the invention and the initial AZ31 sample.

With reference to FIG. 7, the SMAT treated sample possesses enhanced hardness comparing to untreated sample. Preferably, the hardness is increased from 0.95 GPa to 1.62 GPa for a 60%, and the hardness may be in a gradient descending distribution from the surface towards the substrate 22. More preferably, the outermost surface of the metallic glass film 12 may possess a maximum hardness of 3.02 GPa.

Figure 8:
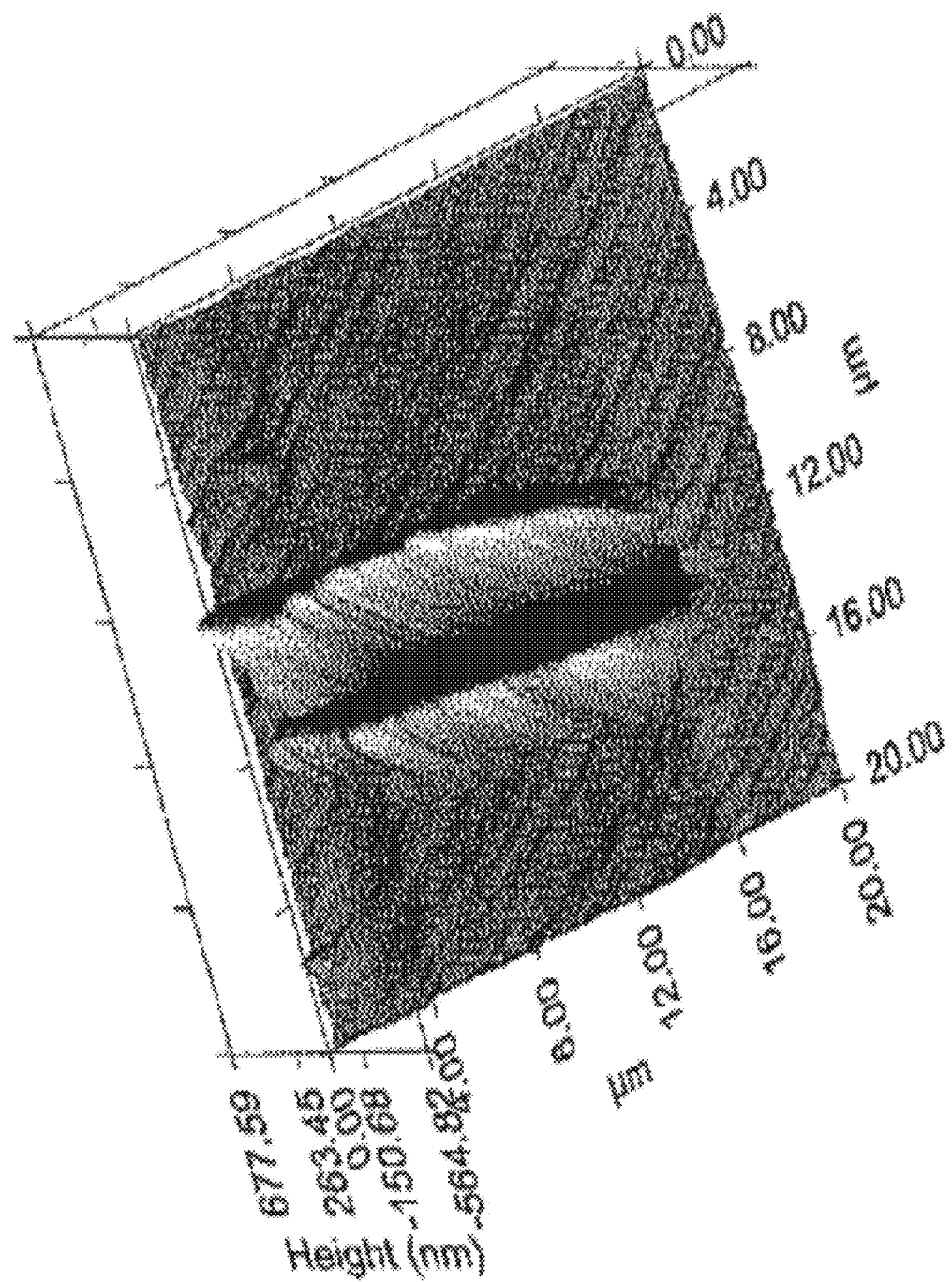
FIG. 8 is the scanning probe microscopy of the multilayer gradient structure AZ31 Mg alloy sample in accordance with the invention after performing 2000 μN nano-wear test.

With reference to FIG. 8, the SMAT treated sample with a metallic glass film 12 having an atomic ratio of Mg, Zn and Ca equals to 60:35:5 deposited thereon possesses an enhanced tensile strength. Preferably, the yield strength is increased from 186 MPa to 231 MPa for a 24%, the Ultimate Tensile Strength is increased from 269 MPa to 305 MPa for a 13% without sacrificing of the ductility.

Figure 9:
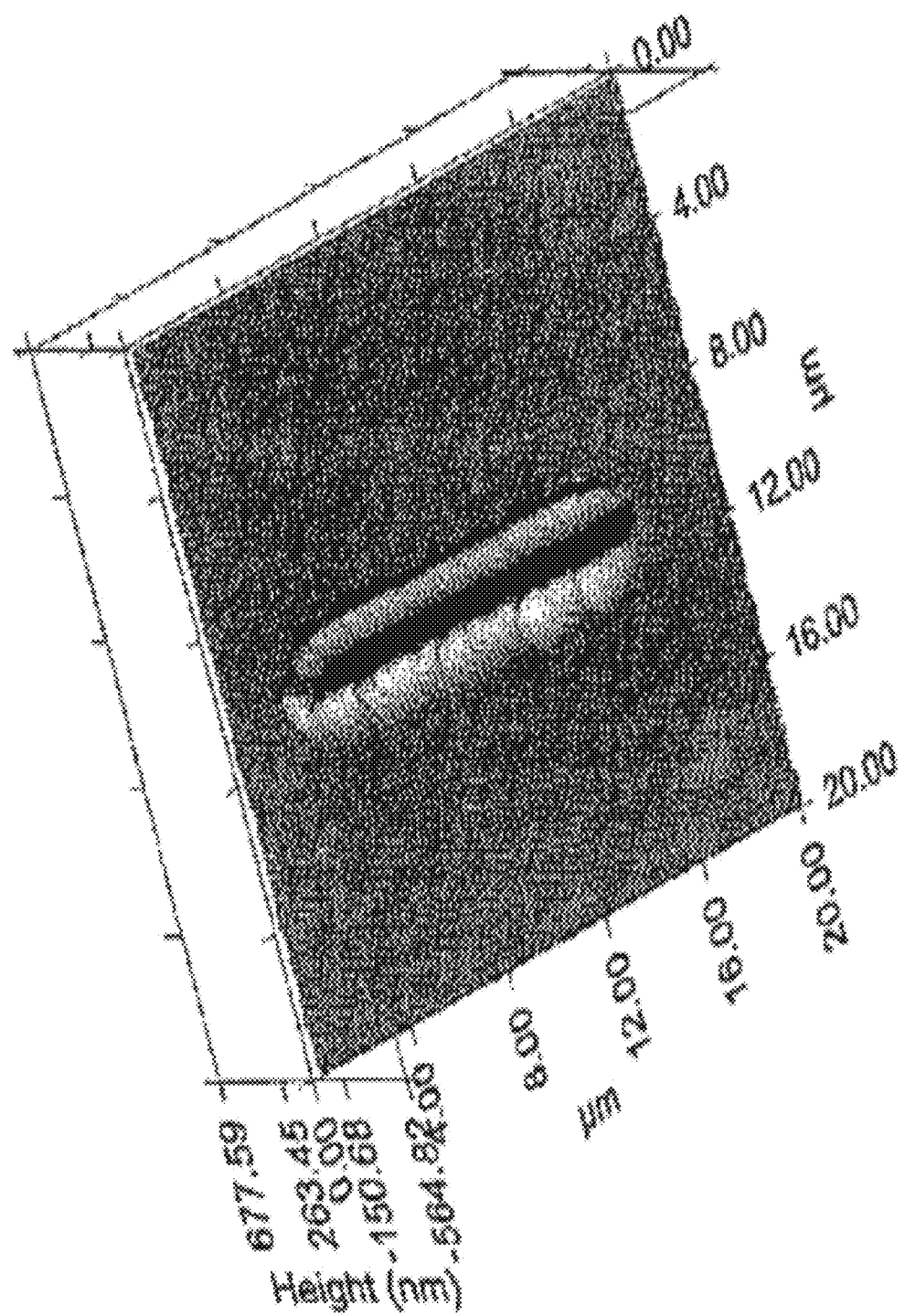
FIG. 9 is the scanning probe microscopy of the initial AZ31 sample after performing 2000 μN nano-wear test.
Figure 10:
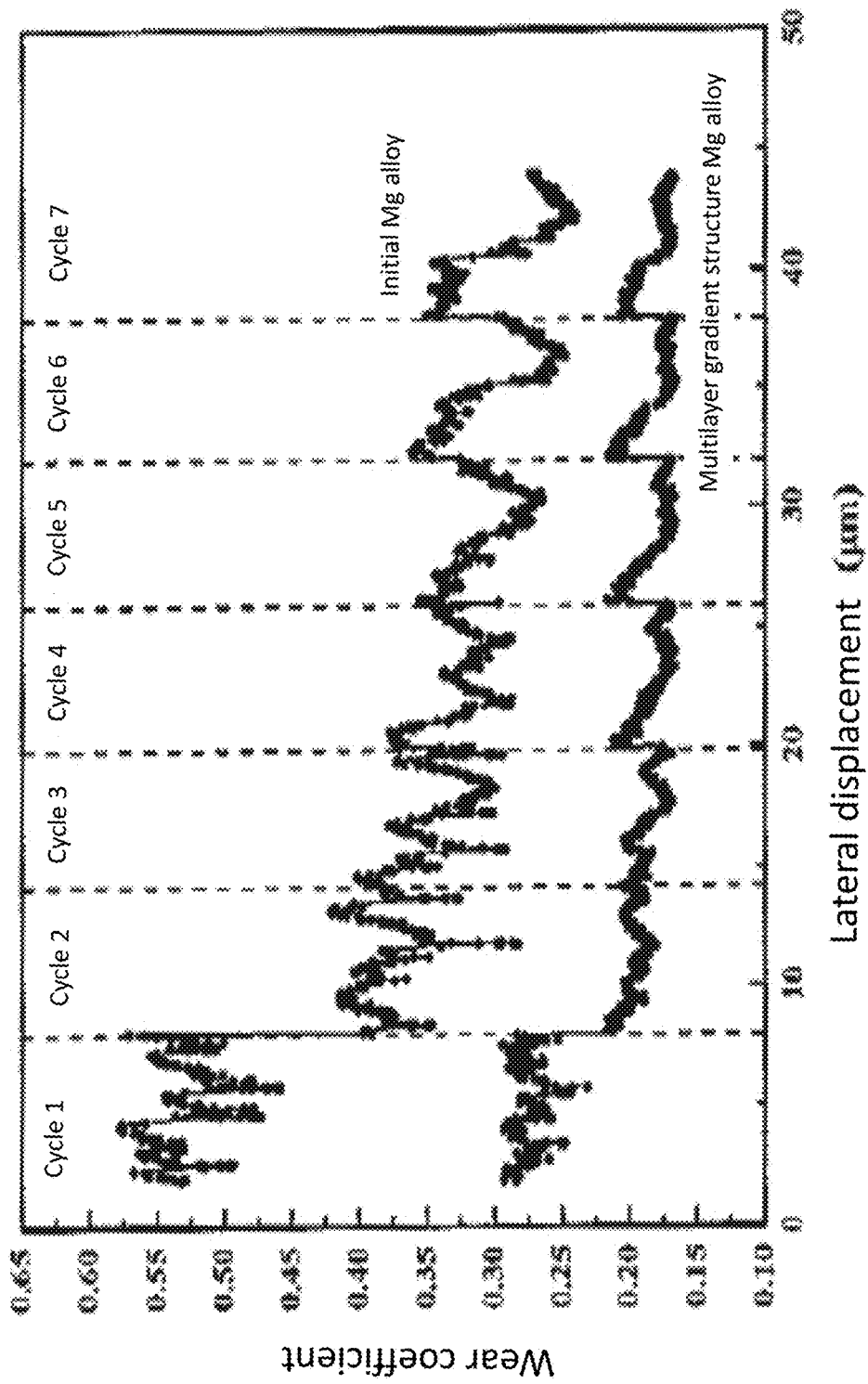
FIG. 10 shows the wear coefficient of the two samples in FIGS. 8 to 9 during the nano-wear test.
Figure 11:
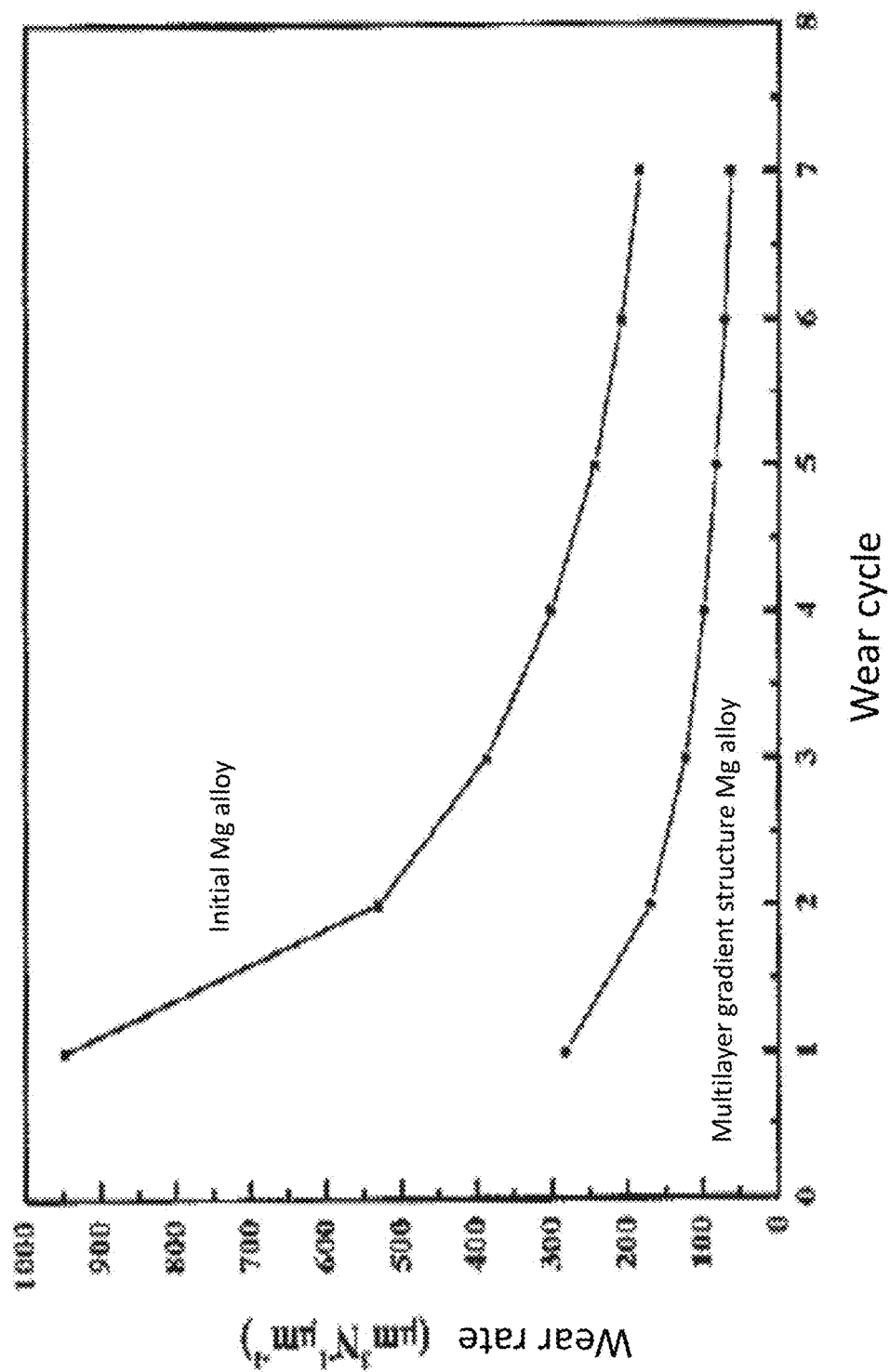
FIG. 11 shows the wearing rate of the two samples in FIGS. 8 to 9 during the nano-wear test.

With reference to FIGS. 9 to 11, the multilayer gradient structure AZ31 Mg alloy suffers a less degree of wear and has a lower wear coefficient than initial AZ31. The inventors have discovered that the multilayer gradient structure 60 in the present invention possesses an excellent wearing resistance. Preferably, the wear coefficient is reduced from 0.35 to 0.18, while the wear rate is reduced from 200 $\mu m^3 N^{-1}$ $\mu m^{-1}$ down to 70 $\mu m^3 N^{-1}$ $\mu m^{-1}$ for 65%, i.e. the wear resistance has been improved for more than 65%.

Figure 12:
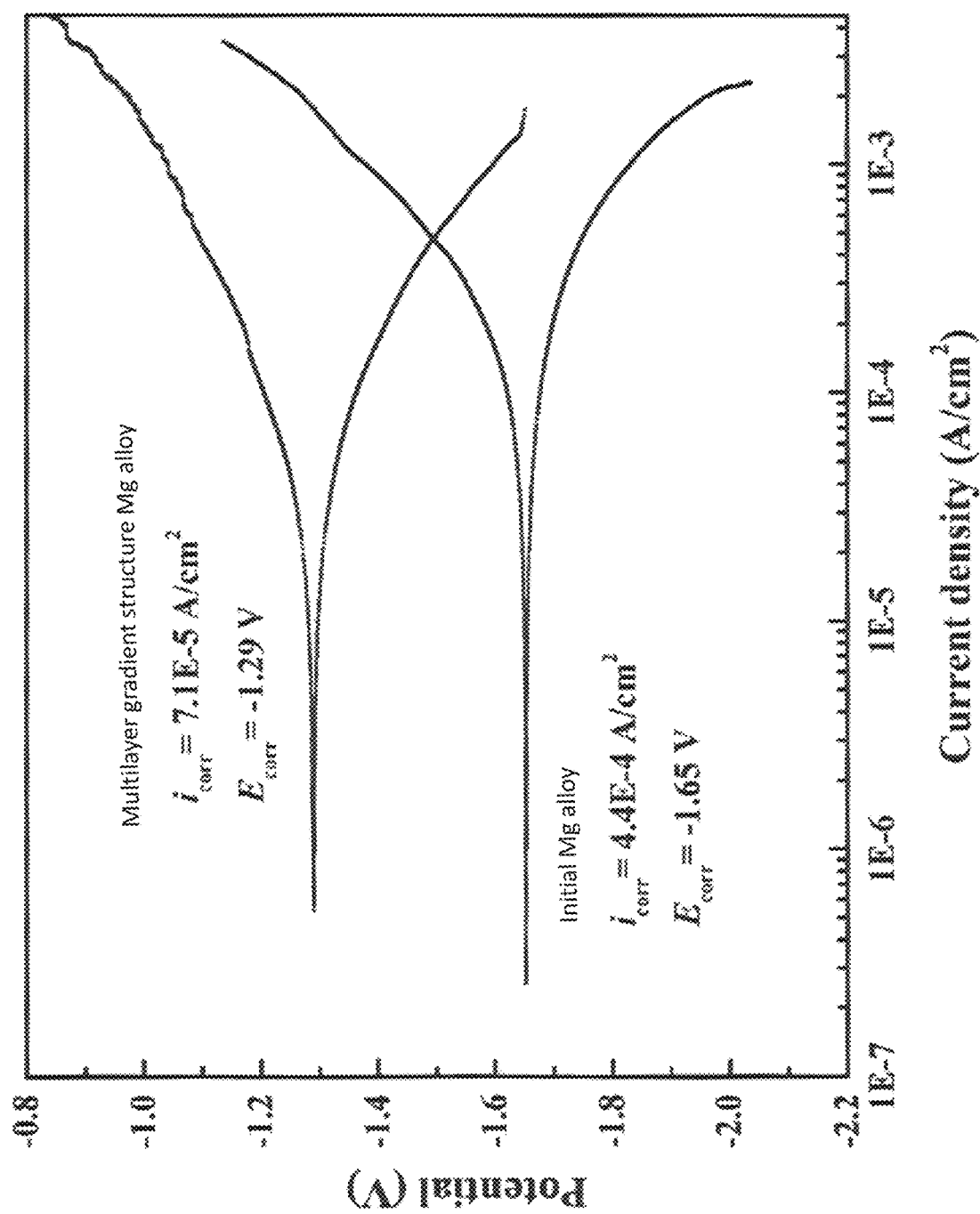
FIG. 12 shows the polarization curve of the multilayer gradient structure AZ31 Mg alloy sample in accordance with the invention and the initial AZ31 sample.

With reference to FIG. 12, the SMAT treated sample with a metallic glass film 12 having an atomic ratio of Mg, Zn and Ca equals to 60:35:5 deposited thereon possesses a polarization voltage increased from −1.65 V up to −1.29 V, a saturated polarization current density reduced from $4.4\times10^{-4}$ A/cm$^2$ down to $7.1\times10^{-5}$ A/cm$^2$. The inventors have discovered that the multilayer gradient structure 60 in the present invention possesses a corrosion resistance of 5 times over conventional untreated materials.

Advantageously, the excellent mechanical properties as well as corrosion resistance of alloy with metallic glass film, and the excellent adhesion between metallic glass film 12 and alloy 22 may be suitable for various applications, such as electronic devices, precision machineries, military weapons, aerospace industries and the like.

Advantageously, the metallic glass film/the multilayer gradient structure 60 may serve as a biocompatible material with ultra-high wear and corrosion resistance, and thus it may be the ideal bio-transplantation material for fabricating bones brackets, prosthetic joints and the like.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A metal structure comprising:
   a first plurality of metal particles arranged in an amorphous structure formed by a magnesium alloy;
   a physically treated second plurality of metal particles arranged in a crystalline structure formed by a magnesium alloy and having at least two grain sizes, wherein the crystalline structure includes a receiving surface arranged to receive the amorphous structure deposited thereon; and wherein the metal structure includes an increased yield strength of at least 24% over the same metal structure without the physically treated second plurality of metal particles.

2. The metal structure in accordance with claim 1, wherein the grain size is arranged in a gradient structure.

3. The metal structure in accordance with claim 2, wherein the grain sizes of the gradient structure decrease gradually from the center of the crystalline structure to the receiving surface of the crystalline structure.

4. The metal structure in accordance with claim 3, wherein the gradient structure includes coarse crystal at the center of the crystalline structure.

5. The metal structure in accordance with claim 4, wherein the gradient structure further includes a nanocrystalline surface at the receiving surface of the crystalline structure.

6. The metal structure in accordance with claim 5, wherein the grain of the nanocrystalline surface includes a size smaller than or equal to 1 µm.

7. The metal structure in accordance with claim 1, wherein the amorphous structure forms a metallic glass film.

8. The metal structure in accordance with claim 1, wherein, the receiving surface of the crystalline structure of the physically treated second plurality of metal particles includes only minor surface indentation and non-substantial cracking about the surface indentation, as compared to the receiving surface of the same crystalline structure without the physically treated second plurality of metal particles.

9. The metal structure in accordance with claim 8, wherein the minor surface indentation and non-substantial cracking are significantly reduced by the high diffusion factor of the crystalline structure.

10. The metal structure in accordance with claim 1, wherein the grain sizes of the amorphous structure and the crystalline structure form a multilayer gradient structure, with the grain sizes being decreased gradually from the center of the crystalline structure to the amorphous structure.

11. The metal structure in accordance with claim 1, wherein the metal structure includes an increased ultimate tensile strength of at least 13% over the same metal structure without the physically treated second plurality of metal particles.

12. The metal structure in accordance with claim 1, wherein the metal structure includes an increased wear resistance of at least 65% over the same metal structure without the physically treated second plurality of metal particles.

13. The metal structure in accordance with claim 1, wherein the metal structure includes an increased corrosive resistance at least 5 times of the same metal structure without the physically treated second plurality of metal particles.

14. The metal structure in accordance with claim 1, wherein the metal structure includes an increased hardness of at least 60% over the same metal structure without the physically treated second plurality of metal particles.

15. The metal structure in accordance with claim 14, wherein the metal structure includes a hardness of at least 3.02 GPa.

* * * * *